United States Patent
Ausserlechner

(10) Patent No.: US 7,353,712 B2
(45) Date of Patent: Apr. 8, 2008

(54) INTEGRATED CIRCUITRY AND METHOD FOR MANUFACTURING THE SAME

(75) Inventor: Udo Ausserlechner, Villach (AT)

(73) Assignee: Infineon Technologies AG, Munich (DE)

( * ) Notice: Subject to any disclaimer, the term of this patent is extended or adjusted under 35 U.S.C. 154(b) by 26 days.

(21) Appl. No.: 11/469,085

(22) Filed: Aug. 31, 2006

(65) Prior Publication Data

US 2007/0063309 A1    Mar. 22, 2007

Related U.S. Application Data

(62) Division of application No. 10/926,807, filed on Aug. 26, 2004, now Pat. No. 7,255,010.

(30) Foreign Application Priority Data

Aug. 29, 2003   (DE) ............................... 103 39 939

(51) Int. Cl.
    *G01B 7/16*   (2006.01)
(52) U.S. Cl. ...................................... 73/777
(58) Field of Classification Search ............... 73/777
    See application file for complete search history.

(56) References Cited

U.S. PATENT DOCUMENTS

| 4,581,706 | A | 4/1986 | Kato et al. ............ 364/506 |
| 4,970,575 | A | 11/1990 | Soga et al. ............ 357/72 |
| 4,994,895 | A | 2/1991 | Matsuzaki et al. ............ 357/72 |
| 5,264,699 | A | 11/1993 | Barton et al. ............ 250/338.4 |
| 5,696,377 | A | 12/1997 | Kanzaki ............ 250/338.4 |
| 5,780,746 | A | 7/1998 | Brady ............ 73/766 |
| 6,441,396 | B1 | 8/2002 | Adams et al. ............ 257/48 |
| 6,496,016 | B1 | 12/2002 | Kozono ............ 324/555 |
| 6,894,517 | B2 * | 5/2005 | Kang et al. ............ 324/765 |
| 6,906,514 | B2 | 6/2005 | Ausserlechner ............ 324/251 |
| 7,019,545 | B2 * | 3/2006 | Kang et al. ............ 324/765 |
| 7,061,062 | B2 | 6/2006 | Flannery ............ 257/415 |
| 2001/0001080 | A1 | 5/2001 | Eldridge et al. ............ 438/611 |
| 2004/0077110 | A1 * | 4/2004 | Kang et al. ............ 438/14 |
| 2005/0040840 | A1 * | 2/2005 | Kang et al. ............ 324/765 |
| 2005/0045879 | A1 * | 3/2005 | Ausserlechner ............ 257/48 |

FOREIGN PATENT DOCUMENTS

DE    689 24 452 T2    3/1996

(Continued)

OTHER PUBLICATIONS

R. Jaeger et al.; CMOS Stress Sensors on (100) Silicon; IEEE Journal of Solid-State Circuits, vol. 35, No. 1, pp. 85-94, Jan. 2000.

*Primary Examiner*—Max Noori
(74) *Attorney, Agent, or Firm*—Eschweiler & Associates, LLC

(57) ABSTRACT

The integrated circuitry on a semiconductor substrate includes an integrated circuit arranged in a circuit area of the semiconductor substrate and a stress-sensitive structure on the semiconductor substrate for detecting a mechanical stress component in the semiconductor substrate, wherein the stress-sensitive structure is implemented to provide an output signal depending on the mechanical stress component in response to an excitation and to a mechanical stress component, wherein the stress-sensitive structure is arranged in a sensor area of the semiconductor substrate and wherein the circuit area and the sensor area are spatially separated.

13 Claims, 3 Drawing Sheets

FOREIGN PATENT DOCUMENTS

| | | |
|---|---|---|
| DE | 101 52 495 A1 | 5/2003 |
| DE | 101 54 498 A1 | 5/2003 |
| DE | 10154498 | 5/2003 |
| JP | 02045194 A | 2/1990 |
| JP | 03197194 A | 8/1991 |
| WO | WO03/040852 | 5/2003 |

* cited by examiner

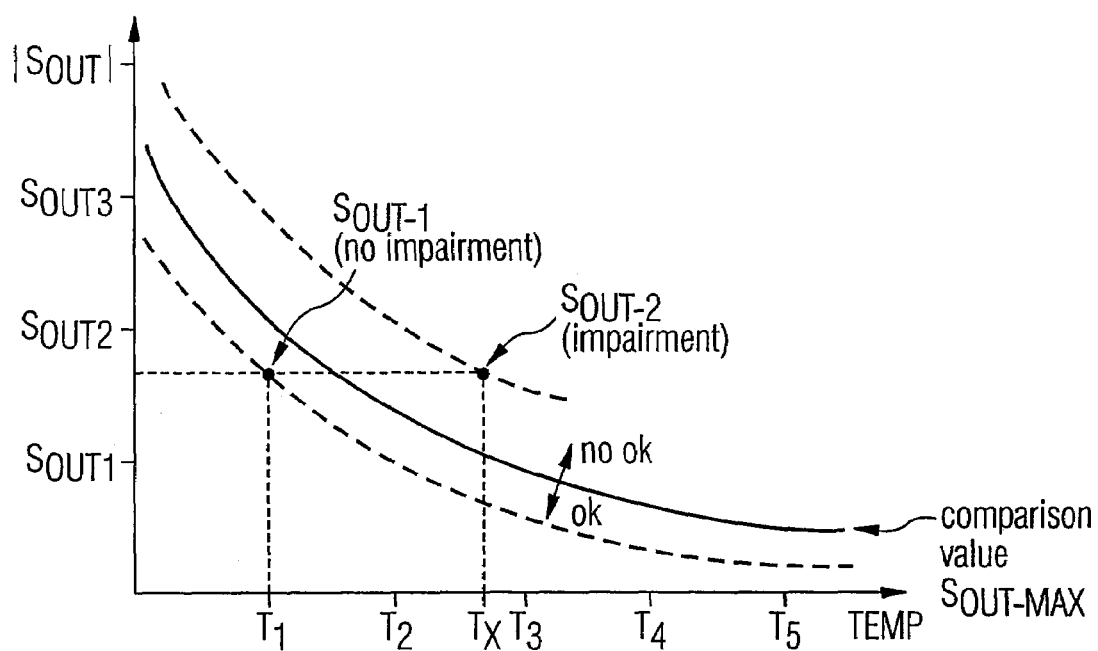

INTEGRATED CIRCUITRY AND METHOD FOR MANUFACTURING THE SAME

PRIORITY

This application is a divisional of U.S. patent application Ser. No. 10/926,807 filed Aug. 26, 2004 now U.S. Pat. No. 7,255,010, which claims priority to German application no. 103 39 939.9 filed Aug. 29, 2003, the contents of which is hereby incorporated in its entirety by reference.

TECHNICAL FIELD OF THE INVENTION

The present invention relates to a circuitry integrated on a semiconductor substrate and to a method for manufacturing the same, wherein it is enabled by means of the inventive integrated circuitry to judge the influence of a mechanical stress component in the semi-conductor substrate on the functioning of the circuitry integrated on the semiconductor substrate.

BACKGROUND OF THE INVENTION

Integrated circuitries or integrated circuits (ICs), respectively, are usually mounted in housings in order to protect the sensitive integrated circuitries from environmental influences. In the process, it is, however, to be observed as an unpleasant side effect that already the housing and mounting of the integrated circuitry in a housing imparts a substantial mechanical stress onto the semiconductor material and thus to the semiconductor substrate of the integrated circuitry. This in particular applies to low-cost housing forms implemented as mass items, like e.g. for such housing forms in which the integrated circuitry is moulded by a casting compound. This casting compound then solidifies by cooling the casting compound from a temperature of about 150° C.-185° C. to ambient temperature. As the semiconductor material of the integrated circuitry and the plastic casting compound material of the housing surrounding the integrated circuitry comprise non-matching thermal coefficients of expansion, the plastic material contracts more strongly when cooling to ambient temperature (room temperature) and therefore exerts a mechanical stress onto the semiconductor material of the integrated circuitry which is hard to predict and therefore not very well reproducible. The plastic material generally comprises a greater coefficient of thermal expansion than the semiconductor material of the integrated circuitry, wherein as a semiconductor material mostly silicon but also germanium, gallium arsenide GaAs, InSb, InP etc. is used.

The mechanical stress (or the mechanical stress, respectively) in the semiconductor material of the semiconductor substrate acting on the integrated circuitry may generally not be reproduced well because of the fact that the mechanical stress depends on the combination of the material used for the semiconductor substrate and for the compound and apart from that on the processing parameters, like e.g. the solidification temperature and solidification time of the compound of the housing of the integrated circuitry.

By different effects in the semiconductor material, so-called piezo-effects, like in particular by the piezo-resistive effect, the piezo-MOS-effect, the piezo-junction effect and the piezo-hall-effect, by a mechanical stress in the semiconductor material of the integrated circuitry also important electric parameters in the integrated circuitry are influenced. In the process, under the general term of "piezo-effects" in this connection the changes of electric parameters of the semiconductor material under the influence of a mechanical stress in the semiconductor material are designated. In particular with indirect semiconductors, like e.g. silicon, germanium, these piezo-effects are strongly developed. Semiconductors are referred to as indirect semiconductor materials in which the energy maximum of the valence band and the energy minimum of the line band are present at different crystal impulses. Direct semiconductor materials, like e.g. GaAs and InSb are semiconductors, however, in which the energy maximum of the valence band and the energy minimum of the line band are present at identical crystal impulses.

The mechanical stress in a semiconductor material may be regarded comparable to an elastic deformation work as a type of excitation energy, which must be added to the energy balance in the semiconductor material. In particular, a mechanical stress in the semiconductor material leads to a change of the band structure of the semiconductor. With indirect semiconductor materials this results in a separation of energy minima, which are actually identical in the stress-free case. This causes, as a further consequence, a new occupation of these energy minima with free charge carriers, wherein a main part of the charge carriers will take on the energetically more favorable state. As the curvature of the band edges, i.e. the edges of the energy bands of the free charge carriers in the semiconductor crystal, i.e. the line band edge for the free electrons and the valence band edge for the free holes, is also different in the different energy minima, different effective masses may be associated with the charge carriers in these energy minima, whereby their behavior with regard to the charge carrier transport is different. In this way, a mechanical stress in the semiconductor material causes the characteristics of the charge-carrier with regard to the charge-carrier transport to change, like e.g. movability, collision time, scattering factor, Hall-constant, etc.

Thus, the piezo-resistive effect indicates, how the specific ohmic resistance of the respective semiconductor material behaves under the influence of a mechanical stress. The piezo junction effect indicates how mechanical stresses in semiconductors leads to a shift of the energy level of the semiconductor material. From this, among others, changes of the characteristic curves of diodes and bipolar transistors result. The piezo Hall effect describes the dependence of the Hall constant of the semiconductor material on the mechanical stress state in the semiconductor material.

It thus becomes clear that with an exceedingly high mechanical stress, the electric functioning of the integrated circuitry may be affected, wherein initially generally only the electronic performance of the integrated circuitry will decrease. This decrease of the performance is for example to be observed in the form of an impairment of the modulation range, the resolution, the band width, the current consumption, the accuracy, etc., wherein it is to be considered that with a higher mechanical stress in the semiconductor material a partial or also complete functioning failure of the integrated circuitry may result which is generally still reversible, however. With an even further increased stress in the semiconductor material finally a crack formation in the semiconductor material will occur, wherein the semiconductor chip may finally break so that an irreversible damage of the integrated circuitry will occur. Typically, the junctions between the different stages of the impairment of the electronic performance of the integrated circuit occur gradually.

In the scientific publication "CMOS Stress Sensors on (100)Silicon" by R. C. Jaeger et al., in IEEE Journal of Solid-State Circuits, Vol. 35, No. 1, January 2000, pp. 85-94, analogue CMOS stress sensor circuits are presented based on the piezo-resistive performance of MOSFETs. The theoretical and experimental results should supply additional design rules for calculating and minimizing the sensitivity of conventional analogue circuits with regard to mechanical stresses in a semiconductor material which are caused due to the accommodation of a semiconductor chip in a housing.

The effects of mechanical stresses on the transistor performance are very important for manufacturers of modern integrated circuits, as by the different manufacturing steps and due to a plurality of housing processes including the chip mounting and encapsulation high values of mechanical stress in the semiconductor material may be caused. The caused mechanical stress may negatively influence the performance of both analogue and digital circuits or may also lead to a complete failure of the integrated circuitry.

It turned out that resistance-based piezo-resistive stress sensors represent a powerful aid for an experimental structure analysis of housed integrated circuitries. The values of integrated resistors are characterized before and after the housing process, wherein resistance values are used based on the piezo-resistive effect in order to calculate the mechanical stress in the material of the semiconductor substrate. If the piezo-resistive sensors are calibrated via a wide temperature range, also thermally caused mechanical stresses may be measured. Finally, also a complete mapping of the stress distribution across the surface of the chip using specially designed test chips may be obtained comprising an array of sensor rosettes.

The above-mentioned scientific publication thus refers to especially designed test chips with special stress sensors in order to experimentally detect mechanical stresses on a semiconductor chip and to indicate simulation and design rules for circuitries from the experimentally obtained results on a semiconductor chip, so that the mechanical stresses caused by the accommodation in a housing in the semiconductor material and the changes of the electrical characteristics of the circuitries associated with the same may be considered in the simulation and the design of the circuitries.

As the mechanical stresses are generally not well reproducible at an integrated circuitry in a semiconductor material, as they depend on the combination of the used materials and the processing parameters, like e.g. solidification temperature and solidification time of the compound mass of the housing of the integrated circuit, a unique characterization of any concerned parameters may generally not lead to the desired aim in the laboratory.

By a professional mounting process with the housing of the integrated circuitry (IC) it is therefore to be prevented that the mechanical stress load of the semiconductor material of the semiconductor chip takes on inadmissibly high values. In the process, primarily attention is only paid to the fact that the semiconductor material of the integrated circuitry does not break. Performance impairments occur, however, very product-specifically and may therefore not always be considered sufficiently in housing development.

Additionally, it is to be noted, that it is necessary again and again to perform small changes in the mounting process on the housing of the integrated circuitry. Thus, it may occasionally be the case that the deliverer for a casting compound has to be changed or that for certain reasons, like e.g. environmental protection measures, a conversion to a special casting material, e.g. to a halogen-free casting material, is to be performed. In practice, with such changes generally post-qualifications with regard to the mounting processes are performed when housing the integrated circuitry. Because these changes may concern many different products, however, in this case the post-qualifications are generally only performed on selected IC groups exemplary for the whole IC product family. The diverse influence possibilities of mechanical stress onto the functioning of a highly integrated circuitry are manifold, however, and are not easily apparent, so that it frequently occurs that with such a change the characteristics of a product become worse due to one of the above effects.

Particularly problematic is the above-explained problem with automotive products, i.e. products for the vehicle area, as these products are frequently subject to extreme temperatures or temperature fluctuations, respectively, but in case of sensors for security systems, like for example ABS sensors, airbag sensors, etc., have to function in a highly reliable way over their complete life. From this group of products the automotive sensors are also very prone to piezo-interactions, as these automotive sensors are frequently subjected to specially extreme temperatures due to their use and need to work a lot more accurately as sensors in security systems than it is the case with simple digital integrated circuitries.

The above-discussed problem is, however, even further increased when the integrated circuitries housed in a housing are again assembled in a module. In vehicle technology this module must be cast frequently in order to protect the same from environmental influences, like e.g. from motor oil, dust, salt water, etc. When casting, again substantial mechanical stresses may be caused in the semiconductor material of the integrated circuitry. It is, however, generally not possible with a reasonable technical effort to keep the manufacturing parameters of those processing sequences sufficiently reproducible, so that also in the course of the production of the above-mentioned module substantial fluctuations of the mechanical stresses in the semiconductor material of the integrated circuitries on the semiconductor chip may result. Thus, the procedure illustrated in the above-mentioned publication for the simulation and assessment of mechanical stresses in a semiconductor material may neither be applied satisfactorily.

Further, in connection with the assessment of the influence of mechanical stresses on the electric characteristics of integrated circuitries it should be considered, and in particular when the mechanical stresses are caused by the accommodation in a housing, that the piezo-effects are very strong at low temperatures. This may on the one hand be attributed to the fact that the piezo-resistive constants increase with a decreasing temperature, wherein on the other hand the stress of the casting materials solidified in the hot state increases with different coefficients of expansion. As the modules already comprise a considerable mass, generally several 100 grams, it is further not possible basically due to the very high technical effort and therefore for cost reasons, to test all manufactured modules at the minimal operation temperature with regard to the problem regarding piezo-effects at the output of the manufacturing line. Due to the considerable mass of for example several 100 grams, a relatively long time period would be required in order to cool every module completely to the minimal operation temperature.

Apart from that, generally during the production of the modules, an attempt is made not to apply temperatures below dew point, as thereby condensed water may result and the same may cause leakage currents in exact electrical measurements. Therefore, before packaging the module the same has to be sufficiently annealed. This would even be required in order to prevent a corrosion of the module within the packaging.

Due to the above-illustrated problem with regard to the stress sensitivity of integrated circuitries, therefore within the product qualification the influence of the piezo-effects is observed in so far that based on individually selected integrated circuitries so-called process split-less worst-case cases with regard to the piezo-effects are generated and the integrated circuitries or circuit modules, respectively, are examined. Accompanying the manufacturing, both at the semiconductor manufacturer and at the module manufacturer sample tests are performed, as it would be extremely cost- and time-consuming to perform corresponding functioning tests on all completed semiconductor devices or modules, respectively.

As mechanical stresses in the semiconductor material of an integrated circuitry were found to be a reliability risk, it was now started to monitor the mechanical stress. The approach according to the prior art is now to detect those electric characteristics of the integrated circuitry which are especially prone to the piezo-effects, wherein those characteristics are then examined in a functioning test after mounting the module or accommodating the integrated circuitry in a housing, respectively. This may for example be performed in semiconductor chip manufacturing, wherein it is generally not possible, however, to perform such cost-and time-consuming electronic tests after the manufacturing of the module, as the integrated circuitry (IC) is already located in a complex system with numerous other components and is not individually acceptable any more.

Additionally, piezo-effects may spread to a system in hardly (or not at all) predictable ways and generate detrimental effects. In particular, mechanical stresses in a semiconductor chip may only cause relatively small observable changes in the integrated circuitry, wherein, however, in connection with other system components, a failure or a performance decrease of the integrated circuitry or the circuit module, respectively, may then result.

Additionally it is to be noted, that according to the prior art still a temperature derivative action for those effects has to be calculated, as those effects may not or cannot be measured at the minimum operation temperature of the integrated circuitry (as explained above). Due to the occurring non-linearities of the used circuit structures this is, however, mainly not sufficiently possible. In addition it is to be noted, that such temperature derivative actions are also again flawed with tolerances.

From the above disclosures it becomes clear that it is very cost and time consuming in chip or module manufacturing, respectively, to examine the functioning of all integrated circuitries accommodated in a housing or module, respectively, with regard to the influence of mechanical stresses in the semiconductor material.

In the simulation of the mechanical stress values in the semiconductor material of an integrated circuitry, which is provided to make predictions with regard to the functioning of the circuitry and to be able to suitably adapt the circuit design of the same, it should be considered, however, that already slight changes of the housing materials, the manufacturing sequence or of individual processing steps may invalidate the practicality and the use of the simulated values.

SUMMARY OF THE INVENTION

Based on this prior art, it is the object of the present invention to provide a simplified concept for judging the influence of mechanical stresses on an integrated circuitry in order to thus be able to simply and reliably judge the functioning of the integrated circuitry even after its housing independent of the respective housing process.

In accordance with a first aspect, the present invention provides an integrated circuitry on a semiconductor substrate, having an integrated circuit arranged in a circuit area of the semiconductor substrate, and a stress-sensitive structure on the semiconductor substrate for detecting a mechanical stress component in the semiconductor substrate, wherein the stress-sensitive structure is implemented to provide an output signal which depends on the mechanical stress component in response to an excitation and to a mechanical stress component, wherein the stress-sensitive structure is arranged in a sensor area of the semiconductor substrate and wherein the circuit area and the sensor area are spatially separated.

In accordance with a second aspect, the present invention provides a method for judging the influence of a mechanical stress component in a semiconductor substrate on the functioning of a circuitry integrated on the semiconductor substrate, wherein the integrated circuitry comprises an integrated circuit arranged in a circuit area of the semiconductor substrate, and a stress-sensitive structure on the semiconductor substrate for detecting a mechanical stress component in the semiconductor substrate, wherein the stress-sensitive structure is implemented to provide an output signal depending on the mechanical stress component in response to an excitation and to a mechanical stress component, wherein the stress-sensitive structure is arranged in a sensor area of the semiconductor substrate and wherein the circuit area and the sensor area are spatially separated from each other, wherein the method includes the steps of detecting an instantaneous value of the mechanical stress component in the semiconductor substrate using the stress-sensitive structure; providing a comparison value for the mechanical stress component in the semiconductor substrate, wherein the comparison value with regard to the detected instantaneous value of the mechanical stress component comprises information with which a statement may be made whether the mechanical stress component in the semiconductor substrate impairs the functioning of the integrated circuitry, and comparing the instantaneous value of the mechanical stress component in the semiconductor substrate to the comparison value for the mechanical stress component in order to obtain a comparison result with a first or a second result value, wherein the first and the second results values comprise an indication to the impairment of the functioning of the integrated circuitry by the mechanical stress component.

In accordance with a third aspect, the present invention provides a device for judging the influence of a mechanical stress component in a semiconductor substrate on the functioning of a circuitry integrated on the semiconductor substrate, wherein the integrated circuitry comprises an integrated circuit arranged in a circuit area of the semiconductor substrate and a stress-sensitive structure on the semiconductor substrate for detecting a mechanical stress component in the semiconductor substrate, wherein the stress-sensitive structure is implemented to provide an output signal which depends on the mechanical stress component in response to an excitation and to a mechanical stress component, wherein the stress-sensitive structure is arranged in a sensor area of the semiconductor substrate, and wherein the circuit area and the sensor area are spatially separated from each other, wherein the device has a detector for detecting an instantaneous value of the mechanical stress component in the semiconductor substrate using the stress-sensitive structure; a provider for providing a comparison value for the mechanical stress component in the semiconductor substrate, wherein the comparison value with regard to the detected instantaneous value of the mechanical stress component comprises information with which a statement may be made whether the mechanical stress component in the semiconductor substrate impairs the functioning of the integrated circuitry; and a comparator for comparing the instantaneous value of the mechanical stress component in the semiconductor substrate to the comparison value for the mechanical stress component to obtain a comparison result with a first or a second result value, wherein the first and the second result values comprise an indication to the impairment of the functioning of the integrated circuitry by the mechanical stress component.

In accordance with a fourth aspect, the present invention provides a method for manufacturing a housed circuitry integrated in a semiconductor substrate, wherein the integrated circuitry comprises an integrated circuit arranged in a circuit area of the semiconductor substrate and a stress-sensitive structure on the semiconductor substrate for detecting a mechanical stress component in the semiconductor substrate, wherein the stress-sensitive structure is implemented to provide an output signal depending on the mechanical stress component in response to an excitation and to a mechanical stress component, wherein the stress-sensitive structure is arranged in a sensor area of the semiconductor substrate, wherein the circuit area and the sensor area are spatially separated from each other, wherein the method includes the steps of providing a non-housed integrated circuitry; determining the functioning of the non-housed integrated circuitry; housing the integrated circuitry in a housing; and determining the influence of housing the integrated circuitry in a housing on its functionality, wherein the step of determining further includes the sub-steps of detecting an instantaneous value of the mechanical stress component in the semiconductor substrate using the stress-sensitive structure; providing a comparison value for the mechanical stress component in the semiconductor substrate, wherein the comparison value with regard to the detected instantaneous value of the mechanical stress component comprises information with which a statement may be made whether the instantaneous mechanical stress component in the semiconductor substrate impairs the functioning of the integrated circuitry, and comparing the instantaneous value of the mechanical stress component in the semiconductor substrate to the comparison value for the mechanical stress component to obtain a comparison result with a first or a second result value, wherein the first and the second result values comprise an indication to the impairment of the functioning of the integrated circuitry by the mechanical stress component.

The present invention is based on the finding that in an integrated circuitry on a semiconductor substrate for judging the influence of a mechanical stress component in the semiconductor substrate on the functioning of a circuitry integrated on the semiconductor substrate the mechanical stress component(s) in the semiconductor substrate is(are) directly detected by a stress-sensitive structure on the semiconductor substrate, wherein the stress-sensitive structure provides an output signal dependent on the mechanical stress component, comprising information by which the influence of the mechanical stress component in the semiconductor substrate on the functioning of the circuit integrated in the semiconductor substrate may be judged. The judging of the influence is preferably performed by the comparison of a provided comparison value to the output signal which depends on the stress component.

According to the invention, it is possible now to provide the output signal of the stress-sensitive structure directly at an output terminal of the integrated circuitry. Alternatively, it is also possible to feed the output signal to the stress-sensitive structure of a further processing means which is associated with the integrated circuitry on the semiconductor substrate, in order to provide the unchanged output signal or a rendered output signal at an output terminal of the integrated circuitry.

A further inventive alternative is to feed the output signal of the stress-sensitive structure to a signal-processing portion of the integrated circuit (as a part of the integrated circuitry on the semiconductor substrate) so that at an output terminal of the integrated circuitry the unchanged output signal or a rendered output signal of the stress-sensitive structure may be output.

It is thus enabled that no additional output terminal pins for providing the output signal of the stress-sensitive structure at the integrated circuitry need to be arranged due to the double use of the integrated circuit. This may also be achieved when several stress sensors are arranged on the semiconductor substrate in a distributed way. Several stress sensors may for example be provided in order to detect the overall stress distribution in the semiconductor substrate.

A double use of the integrated circuit may for example be achieved by the fact that the integrated circuit is operable both in a test operation mode and in a normal operation mode. During the normal operation mode the integrated circuit performs its usual operation, wherein during the test operation mode the output signal of the stress-sensitive structure is for example further processed by a signal-processing portion of the integrated circuit and may be output to an output terminal pin of the integrated circuitry. At that, during the test operation mode for outputting the output signal and during the normal operation mode for outputting the conventional output signal preferably the same output terminal pin of the integrated circuitry may be used.

If the integrated circuit of the integrated circuitry already is a sensor means, e.g. a magnetic field sensor or a pressure sensor, then it is usually relatively simple to apply the stress-sensitive structure to the input of a signal-processing circuit portion of the integrated circuit instead of the sensor means, like e.g. the magnetic field probe or the pressure sensor. Thus, the output signal of the stress-sensitive structure depending on the mechanical stress component may be provided at the output terminal of the integrated circuitry in the test operation mode in the same way as the measurement signal to be detected, like e.g. the magnetic field or pressure signal, during the normal operation mode of the integrated circuit.

It should be noted that the integrated circuit of the integrated circuitry according to the present invention may activate these test operation modes during the normal operation mode independently and automatically, respectively, and thus indicate this important parameter "mechanical stress in the semiconductor substrate of the integrated circuitry" to the overall system (module). Thus, in a simple and low-effort way, the reliability of the overall system may be increased, e.g. of a module with the inventive circuitry.

It is also conceivable, however, that the integrated circuitry performs this test operation mode during the normal operation mode only after a request from another device, e.g. an associated micro-controlling means (microcontroller), wherein the term "after a request" is to be regarded in contrast to the term "automatically".

A further inventive implementation of the present invention is, that in addition to the output signal of the stress-sensitive structure representing an instantaneous value of the mechanical stress component in the semiconductor substrate a comparative value for the mechanical stress component is provided in the semiconductor substrate, wherein the comparison value with regard to the detected instantaneous value of the mechanical stress component comprises information using which a statement may be made whether the instantaneous mechanical stress component in the semiconductor substrate affects the functioning of the integrated circuitry with the integrated circuit.

In order to finally judge, whether the functioning of the integrated circuitry is affected, the instantaneous value of the mechanical stress component in the semiconductor substrate is compared to the comparison value for the mechanical stress component in order to obtain a comparison result with at least a first and a second result value, wherein the first or the second result value, respectively, comprises an indication to the impairment of the functioning of the integrated circuitry with the integrated circuit by a mechanical stress component. The comparison value now generally indicates a maximum admissible value for the mechanical stress component, up to which the functioning of the integrated circuitry with the integrated circuit may be guaranteed.

Preferably, the maximum admissible value at different temperatures is extrapolated based on a reference value at a reference temperature. This saves memory space as no large tables have to be stored and leads to a low calculating effort as only the reference value and a mainly linear extrapolation in the digital part have to be used for calculation.

For the mounting of the IC in the module by the customer it is preferred to implement a similar test mode: in this test mode the calculating unit extrapolates the expected maximum stress (mainly at the admissible temperature) based on the current temperature and signalizes to the operator whether with these "worst-case" conditions the stress is expected to be within the admissible range. By this, the operator saves himself a test at worst-case temperature which is expensive (economically mostly not acceptable) (due to the high thermal mass of the module and the consequently long cooling time).

The comparison result may be that in a comparison of the instantaneous value of the mechanical stress component in the semiconductor substrate to the comparison value for the mechanical stress component it results that the comparison value is fallen low of by the instantaneous value, wherein in this case the first result value is output as an indication for falling low of the comparison value in order to indicate that no impairment is present. If the comparison indicates that the comparison value is exceeded by the instantaneous value, then in this case the second result value is output as an indication for the exceeding of the comparison value in order to indicate that an impairment is present or will probably occur, respectively.

It becomes clear that different values for example in the form of logical levels (high, low, intermediate values) or also bit combinations etc. may be associated with the first and second comparison result.

Accordingly, also the comparison value for the mechanical stress component may be illustrated by a logical level (high, low, intermediate value) or also by bit combinations etc. The comparison value may then very simply for example be stored in a storage means for storing the comparison value and, if required, be provided for an evaluation in order to perform the comparison of the instantaneous value of the mechanical stress component in the semiconductor substrate to the comparison value for the mechanical stress component. As the comparison value preferably indicates a maximum admissible value for the mechanical stress component, it may be indicated by the comparison result whether the functioning of the integrated circuitry may still be guaranteed with the integrated circuit.

According to the invention, the comparison value may also comprise a plurality of individual values, which may respectively be associated with different instantaneous values of one or several ambient variables, like e.g. temperature, pressure etc. of the semiconductor chip, in order to for example indicate a characteristic diagram for the individual values of the comparison value depending on the ambient variable.

The comparison value (or the comparison individual values, respectively) indicating a maximal admissible value for the mechanical stress component may for example be determined and provided "experimentally" by the semiconductor manufacturer preferably for every type of integrated circuitries.

With a mechanical stress of the semiconductor material the stress-sensitive structures which are for example implemented as so-called stress sensors provided the output signal which depends on the stress component. In known stress sensors for example comprising piezo-resistance rosettes or MOS transistors or bipolar transistors, this output signal is nearly linear in a good approximation to the mechanical stress, wherein same is again linear to the temperature difference from the glassivation point of the casting material for the housing of the integrated circuitry in a good approximation.

Thus, in a good approximation based on a measurement value at a certain temperature statements may be made as to how far also with other (higher or lower) temperatures of the operation temperature area of the integrated circuitry the mechanical stresses caused are still within certain (maximum) limits in the semiconductor material.

Thus, a comparison value for the mechanical stress component may be provided, wherein the comparison value may consider a critical output signal as a limit value and required temperature derivative actions of the stress sensor. Thus, with any ambient temperatures a final test may be performed after assembling the integrated circuitry or after assembling a module, respectively, using the integrated circuitry, wherein the output signal of the stress sensor is read out during the test operation mode and compared to the comparison value. Thereby, by the determination of only one measurement value (output signal) with regard to an instantaneous temperature of the integrated circuitry, it may be determined whether the instantaneous value of the mechanical stress component in the semiconductor substrate is still admissible, in order to still guarantee a sufficiently good functioning of the integrated circuitry even in a determined operation temperature range between a pre-settable minimum temperature and a pre-settable maximum temperature.

BRIEF DESCRIPTION OF THE DRAWINGS

These and other objects and features of the present invention will become clear from the following description taken in conjunction with the accompanying drawings, in which:

FIG. 4 shows a schematical illustration in graphical form of a detected output signal $S_{out}$ of a stress-sensitive structure versus temperature with regard to a provided comparison value.

DETAILED DESCRIPTION OF THE PREFERRED EMBODIMENTS

Figure 1:
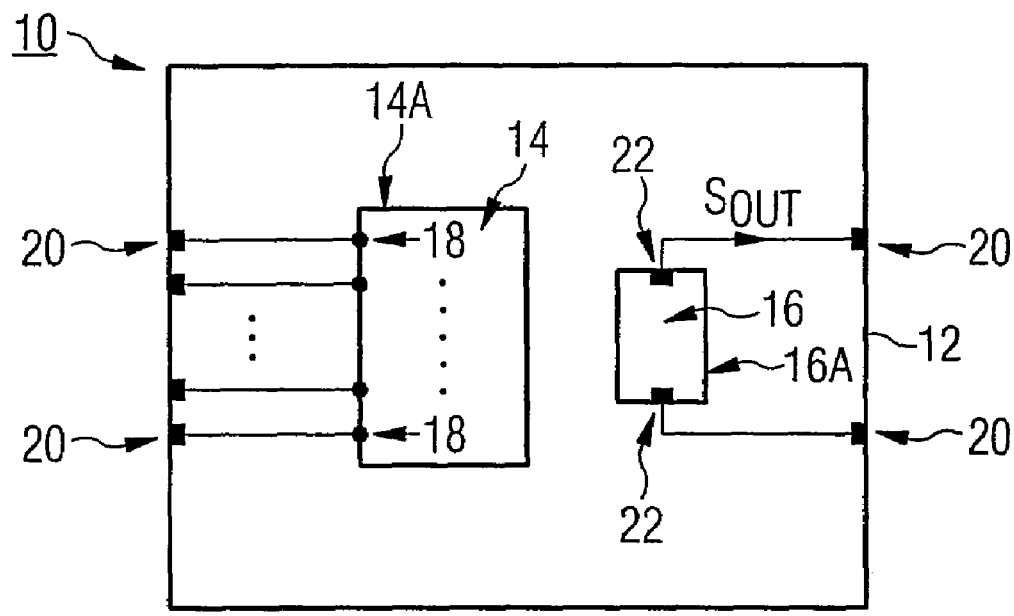
FIG. 1 shows an integrated circuitry on a semiconductor substrate according to a first embodiment of the present invention.

With reference to FIG. 1, in the following a first embodiment of an inventive integrated circuitry 10 is explained.

As it is illustrated in FIG. 1, the integrated circuitry 10 on a semiconductor substrate 12 includes an integrated circuit 14 which is arranged in a circuit area 14a of the semiconductor substrate 12, and a stress-sensitive structure 16 in a sensor area 16a on the semiconductor substrate 12 for detecting a mechanical stress component in the semiconductor substrate 12.

The integrated circuit 14 comprises a plurality of terminal areas 18 which in turn are associated with terminal faces 20 of the integrated circuitry 10, wherein the number of terminal faces 20 illustrated in FIG. 1 is selected only exemplarily for the integrated circuitry 10. The stress-sensitive structure 16 further comprises terminal areas 22. The terminal areas 22 of the stress-sensitive structure 16 are provided in order to provide an output signal $S_{out}$, which depends on the mechanical stress component, in the semiconductor substrate 12, in response to an excitation, e.g. a voltage or current impression into the stress-sensitive structure 16, and in response to a mechanical stress component. As illustrated in FIG. 1, the integrated circuit 14 is arranged in the circuit area 14a on the semiconductor substrate, wherein the stress-sensitive structure 16 is arranged in the sensor area 16a of the semiconductor substrate 12, wherein the circuit area 14a and the sensor area 16a are spatially separated from each other.

In FIG. 1 it is illustrated according to a first alternative of the inventive integrated circuitry 10, that the stress-sensitive structure 16 is for example excited from the outside using a current or voltage impression and that the output signal $S_{out}$ of the stress-sensitive structure may be directly tapped outside on a terminal face 20 of the integrated circuitry 10.

Figure 2:
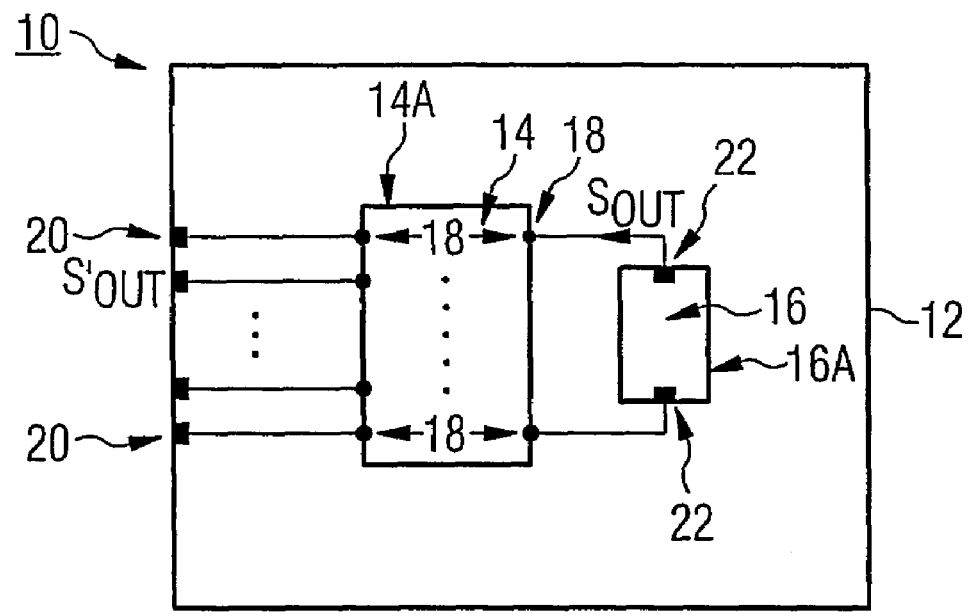
FIG. 2 shows a further inventive implementation of the integrated circuitry according to the present invention.

In FIG. 2, a further alternative of the inventive integrated circuitry 10 is illustrated, in which the stress-sensitive structure 16 is connected to the integrated circuit 14. The stress-sensitive structure 16 is for example excited by the integrated circuit 14 and provides the stress-dependent output signal $S_{out}$ of the integrated circuit 14. The integrated circuit 14 processes the stress-dependent output signal $S_{out}$ of the stress-sensitive structure 16, so that the unchanged output signal $S_{out}$ or a rendered output signal $S'_{out}$ of the stress-sensitive structure 16 may be tapped via one of the output terminals 20 of the integrated circuitry 10.

In the following, now the functioning of the integrated circuitry 10 illustrated in FIGS. 1 and 2 is explained.

For understanding the present invention it should be noted, that the integrated circuit 14 of the integrated circuitry 10 for example represents an integrated sensor arrangement, e.g. a magnetic field sensor or a pressure sensor in the automobile area. As it was already indicated above with reference to the prior art, integrated circuits are subject to a change of their electric or electronic characteristics, respectively, due to the influence of mechanical stresses in the semiconductor material. For this reason, according to the invention, on the semiconductor substrate 12 adjacent to the integrated circuit 14 the stress-sensitive structure 16 is arranged, wherein the stress-sensitive structure 16 is implemented in order to provide an output signal $S_{out}$ which depends on the mechanical stress component in response to an excitation and to a mechanical stress component in the semiconductor substrate 12.

The excitation of the stress-sensitive structure 16 may thus for example be performed using a current impression or a voltage impression into the stress-sensitive structure 16. With a voltage impression into the stress-sensitive structure 16, between two terminal areas 22 of the stress-sensitive structure 16 a fixed voltage is applied, the so-called excitation voltage, wherein a current through the same is set according to the stress-sensitive and stress-dependent resistance of the stress-sensitive structure 16. If now, based on the influence of a mechanical stress in the semiconductor material 12 a resistance change R±ΔR of the stress-sensitive structure 16 results, then according to Ohm's law [U/(R±ΔR)=I±ΔI] with a fixedly impressed voltage U the current I±ΔI changes through the stress-sensitive structure 16 according to the exerted mechanical stress in the semiconductor material of the semiconductor substrate 12.

With a current impression in the stress-sensitive structure 16 a fixed current value, the so-called excitation current, is impressed into the stress-sensitive structure 16, wherein according to the stress-sensitive and stress-dependent resistance of the stress-sensitive structure 16 a voltage may be tapped at the two terminal faces of the stress-sensitive structure 16. If due to the influence of a mechanical stress in the semiconductor material a resistance change ΔR of the stress-sensitive structure 16 results/then according to Ohm's law [U±ΔU=R*(I±ΔI)], with a fixedly impressed current I the voltage U±ΔU across the stress-sensitive structure 16 changes according to the exerted mechanical stress in the semiconductor material of the semiconductor substrate 12.

In FIG. 1 it is illustrated that the excitation of the stress-sensitive structure 16 is performed by use of a current or voltage impression by an external arrangement (not illustrated), wherein in FIG. 2 the excitation of the stress-sensitive structure 16 is performed by means of a current or voltage impression preferably by the integrated circuit 14.

The output signal $S_{out}$ of the stress-sensitive structure 16 which depends on the mechanical stress component, e.g. a stress-dependent voltage or a stress-dependent current, therefore comprises information with regard to the respective instantaneous value of the mechanical stress component in the semiconductor substrate 12. Preferably, the output signal $S_{out}$ of the stress-sensitive structure 16 therefore comprises information by which the influence of the mechanical stress component in the semiconductor substrate 12 on the functioning of the circuit 14 integrated in the semiconductor substrate 12 may be judged.

It should also be noted, however, that the stress-sensitive structure 16 may be connected to predetermined terminal areas 18 of the integrated circuit 14 via its terminal areas 22, as it is also illustrated in FIG. 2. Here, the stress-sensitive structure 16 is preferably connected to the input of a signal-processing portion of the integrated circuit 14. If the stress-sensitive structure 16 is connected to the input of a signal-processing portion of the integrated circuit 14, then the integrated circuit 14 of the integrated circuitry 10 is preferably implemented in order to be operated selectively in a normal operation mode and a test operation mode. During the normal operation mode the integrated circuit 14 of the integrated circuitry 10 performs its usual operation, e.g. a measurement value detection as a sensor means, and provides the correspondingly rendered measurement results at the associated output terminal areas of the integrated circuitry 10.

During the test operation mode, now the output signal $S_{out}$ of the stress-sensitive structure 16 is supplied to the integrated circuitry 10 of the integrated circuit 14, i.e. to the input of the signal-processing portion of the integrated circuit 14, so that at the associated output terminal areas of the integrated circuitry 10 the correspondingly rendered output signal $S'_{out}$ may be provided. The integrated circuit 14 may therefore be switched between the normal operation mode and the test operation mode, wherein the rendered output signal $S'_{out}$ or the output signal $S_{out}$ may be provided in certain predetermined intervals and/or upon request to an associated controller at an output terminal 18 of the integrated circuit 14 and thus at the corresponding output terminal 20 of the integrated circuitry 10.

If now the integrated circuit 14 itself is already a sensor means, e.g. a magnetic field sensor or a pressure sensor, then instead of the respective magnetic field probe or the pressure sensor the stress-sensitive structure 16 in the form of a stress sensor may be applied to an input of the signal-processing portion of the integrated circuit 16 during the test operation mode. Thus, the output signal $S_{out}$ or the rendered output signal $S'_{out}$ of the stress-sensitive structure 16, respectively, which depends on the stress component, may be provided at an output terminal 20 during a test operation mode of the integrated circuitry 10 in the same way as the output signal, like e.g. the measurement or sensor signal (magnetic field or pressure signal) of the integrated circuit 14 during the normal operation mode.

If now for example the integrated circuit 14 of the integrated circuitry is an ABS sensor which provides the information contained in the time course of the detected magnetic field as a digital encoded pulse sequence at its output, then the integrated circuit 14 may again provide the information of the stress-sensitive structure (on-chip stress sensor) arranged on the semiconductor substrate 12 at the output of the integrated circuit 14 again as a digital encoded pulse sequence during the test operation mode for detecting the instantaneous value of the mechanical stress component in the semiconductor substrate 12 by means of the stress-sensitive structure. If the integrated circuit 14 for example includes a linear magnetic field sensor which for example provides a voltage which is linearly proportional to the magnetic field line at an output terminal pin, then, according to the invention, during the test operation mode for detecting the instantaneous value of the mechanical stress component in the semiconductor substrate 12 at the output of the integrated circuit 14 and thus at the normal output terminal pin of the integrated circuitry 10, an analogue voltage may be output which is linearly proportional to the instantaneous value of the mechanical stress component on the surface of the semiconductor substrate 12.

By this proceeding it is possible according to the invention to use the integrated circuit 14 which is anyway present within the integrated circuitry 10 with its signal-processing portion for a signal processing of the respective measurement signal, e.g. magnetic field signal, pressure signal, etc., during the normal operation mode and also during the test operation mode for a detection of a mechanical stress in the form of the instantaneous value of the mechanical stress component in the semiconductor substrate 12 of the integrated circuitry 10.

With regard to the integrated circuitry 10 illustrated in FIGS. 1 and 2 it should be noted, that the stress-sensitive structure 16 which is for example present in the form of an on-chip stress sensor should preferably be as close as possible to the parts of the integrated circuit 14 which are most sensitive with regard to mechanical stresses, in order to be able to provide a relevant signal also with an inhomogeneous distribution of the mechanical stress in the semiconductor substrate 12, in order to judge the influence of a mechanical stress component in the semiconductor substrate on the functioning of the integrated circuitry with the integrated circuit 14.

As the most stress-sensitive circuit parts of the integrated circuit are mainly present in the interior of the semiconductor substrate 12, i.e. typically in the center of the respective semiconductor chip and typically not at the substrate edges, also the stress-sensitive structure 16 should be arranged there. Alternatively, of course, also several stress-sensitive structures 16 may be arranged on the semiconductor substrate 12 in different locations in order to thus for example be able to judge the overall distribution of the mechanical stress on the semiconductor substrate 12.

It should further be noted that the mechanical stress on the semiconductor substrate is given by several components of the mechanical stress tensor, so that in an extended system with several stress sensors also different stress sensors may be used which react to different components or different combinations of components, respectively, of the mechanical stress tensor. The stress state in a semiconductor material is generally very complex to be illustrated as there are six independent components for the mechanical stress tensor alone. For the planar stress state, as it acts on the surface of an integrated circuit, the number of interesting components of the stress tensor may be reduced to three, i.e. two normal stress components and one shearing stress component. Thus, for example the difference of the normal stress components of the stress tensor in the plane of the semiconductor substrate 12 and the shearing stress component in the plane of the semiconductor substrate 12 can be measured.

With the integrated circuitry 10 illustrated in FIG. 2 it is advantageously also possible without additional output pins to use the stress test structures in the form of stress-sensitive structures 16 on the semiconductor substrate 12. This is achieved by making the stress-sensitive structure 16 on the semiconductor substrate 12 accessible for detecting certain components or component combinations of the mechanical stress tensor on the surface of the semiconductor substrate 12 (or within the same, respectively) by different test operation modes (or during the same, respectively). The test operation modes may then for example be used in order to determine whether as a consequence of the manufacturing process for accommodating the integrated circuitry in a housing a mechanical stress is exerted on the integrated circuitry accommodated in the housing which is too high.

For this purpose, according to the invention a comparison value for the mechanical stress component will be provided, as it is explained in more detail in the following with reference to the further FIGS. 3 and 4.

The comparison value for the mechanical stress component for example indicates a maximum admissible value for the mechanical stress component in the semiconductor substrate 12 up to which the functioning of the integrated circuit 14 and thus of the integrated circuitry 10 may be guaranteed. With this maximum admissible value for the mechanical stress in the semiconductor substrate the stress-sensitive structure 16 provides a certain output signal $S_{out-max}$. This output signal $S_{out-max}$ is in good approximation linear to the mechanical stress component in the semiconductor substrate 12 in all known methods for the detection of the mechanical stress component in the semiconductor substrate 12, for example in piezo-resistance rosettes or MOS transistors or bipolar transistors, wherein the mechanical stress is in turn in good approximation linear to the temperature difference from the glassivation point in the accommodation of the integrated circuitry 10 in a housing. Thus, the output signal $S_{out}$ of the stress-sensitive structure 16 may be used by a comparison to the comparison value $S_{out-max}$ according to the invention for judging the influence of a mechanical stress component in the semiconductor substrate 12 on the functioning of the circuitry 10 integrated in the semiconductor substrate, as it is explained now in more detail in the following with reference to FIGS. 3 and 4.

The mechanical stress has a sign. Mainly it is sufficient if the amount of the mechanical stress is smaller than a maximum admissible value. More generally, however, a lower Smin and an upper Smax limit are defined, wherein the stress is admissible when the following holds true: Smin<S<Smax.

Figure 3:
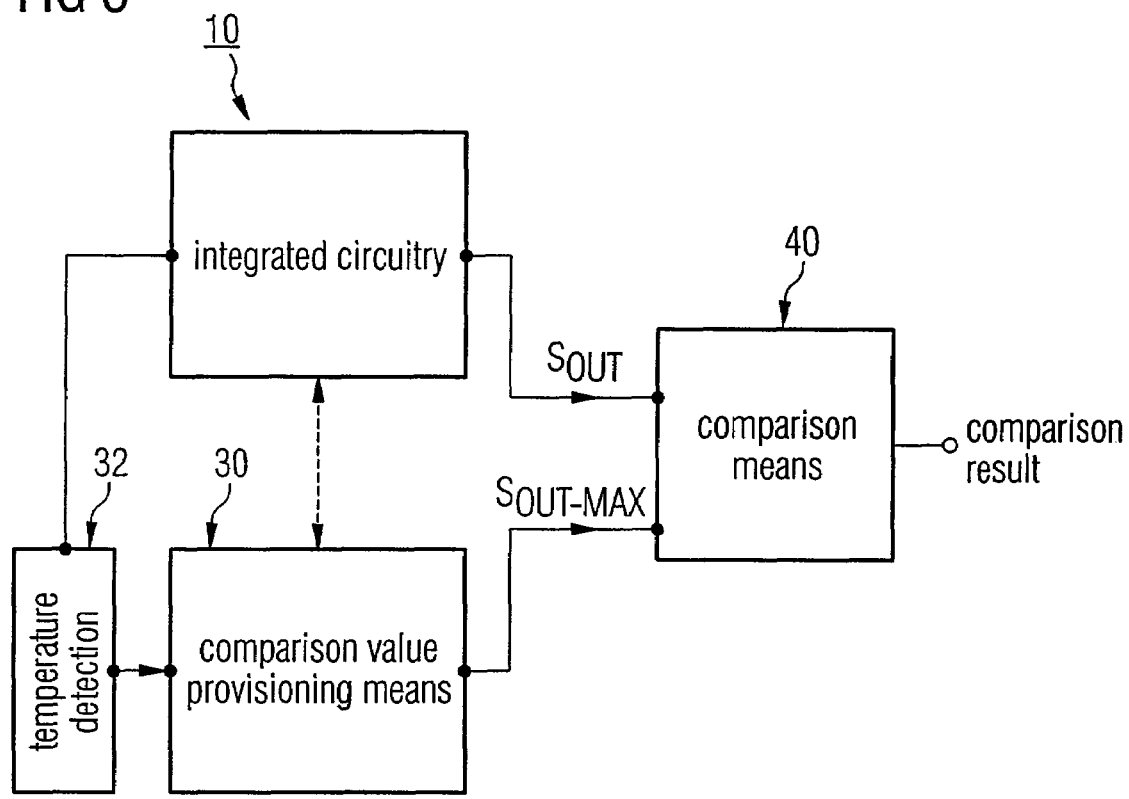
FIG. 3 shows a schematical illustration of the inventive device for judging the influence of a mechanical stress component in a semiconductor substrate on the functioning of a circuitry integrated on the semiconductor substrate.

As it is illustrated in FIG. 3, the device for judging the influence of a mechanical stress component in the semiconductor substrate 12 on the functioning of the circuitry 10 integrated on the semiconductor substrate 12 comprises a comparison value provisioning means 30 and a comparison means 40 and optionally a temperature detection means 32.

Using the stress-sensitive structure 16 of the integrated circuitry 10 an instantaneous value of the mechanical stress component in the semiconductor substrate 12 is detected and provided as an output signal $S_{out}$ (or $S'_{out}$, respectively) at the output of the integrated circuitry 10 for example during the test operation mode of the same. If, as it is illustrated in FIG. 1, a separate output terminal pin is provided for the output signal $S_{out}$, then the output signal $S_{out}$ at the output of the integrated circuitry 10 may for example also be provided permanently.

Further, by means of the comparison value provisioning means 30 and a comparison value $S_{out-max}$ is provided for the mechanical stress component in the semiconductor substrate 12, wherein the comparison value $S_{out-max}$ with regard to the detected instantaneous value of the mechanical stress component comprises information using which a statement may be made whether the instantaneous mechanical stress component in the semiconductor substrate 12 impairs the functioning of the integrated circuit 14 and thus of the integrated circuitry 10.

As it is illustrated in FIG. 3, now the instantaneous value of the mechanical stress component in the semiconductor substrate 12 in the form of the output signal $S_{out}$ is compared to the comparison value $S_{out-max}$ for the mechanical stress component by means of the comparison means 14 in order to obtain a comparison result with a first or a second result value at the output of the comparison means 40, wherein the first and the second result values comprise an indication to the impairment of the functioning of the integrated circuitry by the mechanical stress component in the semiconductor substrate 12. The comparison value now preferably indicates a maximum admissible value $S_{out-max}$ for the mechanical stress component, up to which the functioning of the integrated circuitry with the integrated circuit may be guaranteed.

In this connection, reference is further made to FIG. 4, illustrating an exemplary purely schematical illustration in graphical form of a detected standardized output signal $S_{out}$ of a stress-sensitive structure 16 over temperature with regard to a provided comparison value $S_{out-max}$.

If the comparison of the comparison value $S_{out-max}$ to the instantaneous value $S_{out}$ results in the comparison value being fallen low of by the instantaneous value (see $S_{out-1}$ in FIG. 4), for example in this case the first result value is output as an indication for falling low of the comparison value. If, however, the comparison indicates that the comparison value is exceeded by the instantaneous value (see $S_{out-2}$ in FIG. 4), in this case the second result value is output as an indication for exceeding the comparison value. As the comparison value preferably indicates a maximum admissible value for the mechanical stress component, it may be indicated by the comparison result whether the functioning of the integrated circuitry with the integrated circuitry 10 is still guaranteed or not.

For simplifying the further processing of the first and the second comparison result, the same may for example comprise any different levels in the form of logical values (high, low, intermediate values) or even bit combinations. Also the comparison value for the mechanical stress component may be present in the form of a logical value (high, low, intermediate value) or also of a bit combination, so that the comparison value is for example stored in a storage means for storing the comparison value and may be provided as required to perform the comparison of the instantaneous value of the mechanical stress component in the semiconductor substrate to the comparison value for the mechanical stress component.

The instantaneous value of the mechanical stress component in the semiconductor substrate 12 is provided by means of the output signal $S_{out}$ at the output of the integrated circuitry 10, as it was explained in detail with reference to the integrated circuitry 10 of FIGS. 1 and 2.

In the following, it is explained now, how the comparison value $S_{out-max}$ for the mechanical stress component in the semiconductor substrate 12, which indicates a maximum admissible value for the mechanical stress component in the semiconductor substrate 12, up to which the functioning of the integrated circuit 14 and thus of the overall integrated circuitry 10 may be guaranteed, is determined and provided to the comparison means 40.

The semiconductor manufacturer may for example determine a maximum admissible value ($S_{out-max}$) for the mechanical stress component in the semiconductor substrate 12 by different test installations from which the functioning of the integrated circuit may be impaired or not be (fully) guaranteed any more. As the consequences of mechanical stress components in the semiconductor substrate 12 on the functioning of the circuitry 10 integrated on the semiconductor substrate 12 may also depend on certain ambient variables and in particular on the temperature, the comparison value preferably comprises a plurality of individual values, wherein each individual value is associated with an instantaneous value of the ambient variable, i.e. preferably the appropriate temperature value is associated with every individual value of the comparison value for the mechanical stress component.

The comparison value or the plurality of individual values with the associated temperature values, respectively, may now for example be stored or documented in a storage means or in any other way. The temperature detection means 32 optionally provided in FIG. 3 is now provided (if required) to provide an instantaneous value of the temperature at the integrated circuitry 10 of the comparison value provisioning means 30.

As the integrated circuitry 10 provides a certain output signal $S_{out-max}$ with this maximum admissible mechanical stress in the semiconductor substrate 12 by means of the stress-sensitive structure 16 which is in a good approximation linear to the mechanical stress in the semiconductor substrate 12 almost in all known methods, e.g. in piezo-resistance rosettes or MOS transistors or bipolar transistors, and this mechanical stress is in turn in a good approximation linear to the temperature difference originating from the glassivation point when accommodating the integrated circuitry 30 in a housing, also a calculating regulation or formula, respectively, may be stored in the comparison value provisioning means 30 which calculates or indicates, respectively, the comparison value $S_{out\text{-}max}$ depending on the instantaneous temperature of the integrated circuitry 10 for the mechanical stress component based on an instantaneous ambient temperature at the integrated circuitry 10.

Thus, for the integrated circuitry 10 a critical output signal $S_{out\text{-}max}$ and necessary temperature derivative actions of the stress-sensitive structure 16 may be provided. Thus, at any temperature a final test of the integrated circuitry 10 may be performed after assembling the same in a module, i.e. after an accommodation also with another components in a housing, wherein the instantaneous value of the mechanical stress component in the semiconductor substrate 12 is determined using the stress-sensitive structure 16 of the integrated circuitry 10. This instantaneous value is now compared to a comparison value provided by the comparison value provisioning means 30 by means of the comparison means 40 in order to determine whether this instantaneous value is still reliable in order to still guarantee a sufficiently good functioning of the integrated circuitry 10 in the overall operation temperature range of the integrated circuitry 10, i.e. between a pre-settable minimum operation temperature and a maximum operation temperature.

The inventive concept for judging the influence of a mechanical stress component in the semiconductor substrate 12 on the functioning of the circuitry 10 integrated on the semiconductor substrate 12 may be still extended in so far that also during the normal operation mode of the integrated circuitry the test operation modes are activated independently (automatically) and thus the important parameter "mechanical stress on the semiconductor substrate 12" may be indicated to an overall system. Thus, the reliability of the overall system may be further increased. It is of course also conceivable that the integrated circuitry 10 only performs the test operation mode during the normal operation after a request of another device, e.g. a microcontroller, wherein this is to be understood in contrast to "automatically".

Further, in FIG. 3 optionally a direct connection (dashed line) between the integrated circuitry 10 and the comparison value provisioning means 30 is illustrated which is to indicate that the provisioning of the output signal $S_{out}$ of the integrated circuitry 10 during the test operation mode and the provisioning of the comparison value by the comparison value provisioning means 30 may for example be timed and coordinated by means of a controller (not shown in FIG. 3) for the comparison by the comparison means 40.

Further, the inventive concept may in particular be used for the case that it is demanded from the semiconductor manufacturer to provide only the "bare" integrated circuitries which are not housed in a housing, wherein the housing process is only performed later. This is referred to as a so-called bare die delivery. Thereby, the overall system in the form of a module may be manufactured with less effort and therefore more cost-effectively, as one mounting process of the integrated circuitry 10 in a module instead of two mounting processes is sufficient. On the other hand, during the final module manufacturing several possibilities are available and the standard housings of microelectronics need not necessarily be employed, as they are generally used in semiconductor manufacturing.

If the integrated circuitry 10 is not functioning any more after mounting and accommodating the same in the module, was still fully functional in the wafer test during semiconductor manufacturing, however, then it may be judged with the present inventive concept in a simple way, whether the integrated circuitry 10 is susceptible to piezo-influences or whether during module manufacturing (by the semiconductor manufacturer himself or by a customer) due to the accommodation in a housing a mechanical stress acts on the integrated circuitry 10 which is too large. With the inventive concept a unique criterion may now advantageously be indicated to the semiconductor manufacturer for the functioning of his bare IC, i.e. its bare integrated circuitry 10, in order to be able to fathom which production step is responsible for a possible malfunction of the integrated circuitry 10.

Thus, by the inventive concept for judging the influence of a mechanical stress component in a semiconductor substrate 12 on the functioning of a circuitry 10 integrated on the semiconductor substrate 12 a clear cut between the different production stages and therefore in case of doubt between the semiconductor manufacturer and the customer is provided.

By means of the inventive concept now advantageously a housed circuitry 10 integrated in a semiconductor substrate may be produced and realized, wherein the integrated circuitry comprises the integrated circuit 14 and the stress-sensitive structure 16 on the semiconductor substrate 12. For this, first of all a non-housed integrated circuitry 10 is provided, wherein subsequently the functioning of the non-housed integrated circuitry is either determined still on-wafer or already in the diced state. Subsequently, the integrated circuitry 10 is housed in a housing, whereupon the influence of housing the integrated circuitry 10 in a housing on its functioning is determined by detecting the instantaneous value of the mechanical stress component in the semiconductor substrate using the stress-sensitive structure 16, providing the comparison value for the mechanical stress component in the semiconductor substrate 12 and comparing the instantaneous value of the mechanical stress component in the semiconductor substrate to the comparison value for the mechanical stress component.

With reference to the detected instantaneous value of the mechanical stress component the comparison value comprises information with which a statement may be made whether the instantaneous mechanical stress component in the semiconductor substrate impairs the functioning of the integrated circuitry (10). By comparing the instantaneous value of the mechanical stress component in the semiconductor substrate to the comparison value for the mechanical stress component a comparison result with a first or second result value is obtained, wherein the first and the second result values comprise an indication to the impairment of the functioning of the integrated circuitry (10) by the mechanical stress component.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

I claim:

1. A method for judging the influence of a mechanical stress component in a semiconductor substrate on the functioning of a circuitry integrated on the semiconductor substrate, wherein the integrated circuitry comprises an integrated circuit arranged in a circuit area of the semiconductor substrate, and a stress-sensitive structure on the semiconductor substrate for detecting a mechanical stress component in the semiconductor substrate, wherein the stress-sensitive structure is implemented to provide an output signal, which depends on the mechanical stress component, in response to an excitation and to a mechanical stress component, wherein the stress-sensitive structure is arranged in a sensor area of the semiconductor substrate and wherein the circuit area and the sensor area are spatially separated from each other, the method comprising the steps of:

detecting an instantaneous value of the mechanical stress component in the semiconductor substrate using the stress-sensitive structure;

providing a comparison value for the mechanical stress component in the semiconductor substrate, wherein the comparison value with regard to the detected instantaneous value of the mechanical stress component comprises information with which a statement may be made whether the mechanical stress component in the semiconductor substrate impairs the functioning of the integrated circuitry, and comparing the instantaneous value of the mechanical stress component in the semiconductor substrate to the comparison value for the mechanical stress component in order to obtain a comparison result with a first or a second result value, wherein the first and the second results values comprise an indication to the impairment of the functioning of the integrated circuitry by the mechanical stress component.

2. The method according to claim 1, wherein the comparison value indicates a maximum admissible value for the mechanical stress component up to which the functioning of the integrated circuitry is not impaired by the mechanical stress component.

3. The method according to claim 1, wherein the comparison value comprises a plurality of individual values, wherein an instantaneous value of an ambient variable is associated with every individual value.

4. The method according to claim 3, wherein the ambient variable is the ambient temperature.

5. The method according to one of claim 1, wherein the integrated circuitry is operable in a normal operation mode and a test operation mode.

6. The method according to claim 5, wherein the steps of detecting, providing and comparing are performed during the test operation mode of the integrated circuitry.

7. The method according to claim 6, wherein the step of providing includes a look-up in a table set up by the manufacturer of the integrated circuit with maximum admissible stress values for the integrated circuit.

8. The method according to claim 7, wherein the table includes maximum admissible stress values for different temperatures.

9. A device for judging the influence of a mechanical stress component in a semiconductor substrate on the functioning of a circuitry integrated on the semiconductor substrate, wherein the integrated circuitry comprises an integrated circuit arranged in a circuit area of the semiconductor substrate and a stress-sensitive structure on the semiconductor substrate for detecting a mechanical stress component in the semiconductor substrate, wherein the stress-sensitive structure is implemented to provide an output signal, which depends on the mechanical stress component, in response to an excitation and to a mechanical stress component, wherein the stress-sensitive structure is arranged in a sensor area of the semiconductor substrate, and wherein the circuit area and the sensor area are spatially separated from each other, wherein the device comprises:

a detector for detecting an instantaneous value of the mechanical stress component in the semiconductor substrate using the stress-sensitive structure;

a provider for providing a comparison value for the mechanical stress component in the semiconductor substrate, wherein the comparison value with regard to the detected instantaneous value of the mechanical stress component comprises information with which a statement may be made whether the mechanical stress component in the semiconductor substrate impairs the functioning of the integrated circuitry; and a comparator for comparing the instantaneous value of the mechanical stress component in the semiconductor substrate to the comparison value for the mechanical stress component to obtain a comparison result with a first or a second result value, wherein the first and the second result values comprise an indication to the impairment of the functioning of the integrated circuitry by the mechanical stress component.

10. The device of claim 9, wherein the comparison value indicates a maximum admissible value for the mechanical stress component up to which the functioning of the integrated circuitry is not impaired by the mechanical stress component.

11. The device according to claim 9, wherein the comparison value comprises a plurality of individual values, wherein an instantaneous value of an ambient variable is associated with every individual value.

12. The device according to claim 11, wherein the ambient variable is the ambient temperature or the instantaneous temperature of the semiconductor material of the integrated circuitry.

13. The device according to one of claim 9, wherein the device further comprises a detector for detecting an ambient variable.

* * * * *

UNITED STATES PATENT AND TRADEMARK OFFICE
CERTIFICATE OF CORRECTION

PATENT NO. : 7,353,712 B2 Page 1 of 1
APPLICATION NO. : 11/469085
DATED : April 8, 2008
INVENTOR(S) : Udo Ausserlechner It is certified that error appears in the above-identified patent and that said Letters Patent is hereby corrected as shown below:

Column 12, line 26, please replace the phrase "faces of" with the phrase --faces 22 of--

Column 14, line 46, please replace the phrase "circuitry in" with the phrase --circuitry 10 of--

Column 19, line 40, claim 5, please delete the phrase "one of"

Column 20, line 48, claim 13, please delete the phrase "one of"

Signed and Sealed this

Fifth Day of August, 2008

JON W. DUDAS
*Director of the United States Patent and Trademark Office*